(12) United States Patent
Chen et al.

(10) Patent No.: US 7,719,025 B2
(45) Date of Patent: May 18, 2010

(54) INTEGRATED CIRCUIT ESD PROTECTION

(75) Inventors: Qiang Chen, Sollentuna (SE); Gordon Ma, Phoenix, AZ (US)

(73) Assignee: Infineon Technologies AG, Munich (DE)

( * ) Notice: Subject to any disclaimer, the term of this patent is extended or adjusted under 35 U.S.C. 154(b) by 240 days.

(21) Appl. No.: 11/550,650

(22) Filed: Oct. 18, 2006

(65) Prior Publication Data

US 2008/0093624 A1  Apr. 24, 2008

(51) Int. Cl.
*H01L 29/74* (2006.01)
(52) U.S. Cl. .............................. 257/173; 257/E29.012; 257/E29.013; 257/170
(58) Field of Classification Search ................ 257/104, 257/106, 343, 355–356, 360–362, 401, 481, 257/491–493, 551, 603–605, 127, 170, 173, 257/409, 452, 484, 490, 494, 495, 509, 647, 257/E29.012, E29.013
See application file for complete search history.

(56) References Cited

U.S. PATENT DOCUMENTS

| | | | | |
|---|---|---|---|---|
| 5,023,678 A * | 6/1991 | Kinzer | | 257/339 |
| 5,212,398 A | 5/1993 | Matsunaga et al. | | |
| 7,098,509 B2 * | 8/2006 | Zdebel et al. | | 257/355 |
| 7,402,874 B2 * | 7/2008 | Wu | | 257/401 |
| 2004/0183098 A1 * | 9/2004 | Khemka et al. | | 257/200 |

\* cited by examiner

*Primary Examiner*—David Vu
*Assistant Examiner*—Suberr Chi
(74) *Attorney, Agent, or Firm*—Coats & Bennett, P.L.L.C.

(57) ABSTRACT

A protective device in a semiconductor may comprise a substrate of a first conductivity type, an epitaxial layer formed on top of the substrate, a body area formed within the epitaxial layer of a second conductivity type extending from a top surface into the epitaxial layer, a first area of the first conductivity type extending from the top surface into the body area, an isolation area surrounding the first area, a ring area of the first conductivity type surrounding the isolation area, and a coupling structure for connecting the ring area with the substrate.

26 Claims, 6 Drawing Sheets

INTEGRATED CIRCUIT ESD PROTECTION

BACKGROUND

Integrated Circuits, in particular radio frequency (RF) power devices with laterally doped metal oxide semiconductor transistors (LDMOS), up to now use electro static discharge (ESD) protection which comprises an asymmetrical behavior against the gate voltage polarity. The breakdown and turn-on voltages of these ESD devices is about +15V and −0.7V. Therefore, the gate bias setting of an LDMOS product is limited to gate source Voltages Vgs of greater than −0.7V. For high linear efficiency RF-power applications, however, a negative gate voltage swing below −0.7V may occur. In addition, the −0.7V bias voltage may cause some issues with respect to ruggedness under certain RF applications.

Therefore, a need exists to provide a better ESD protection for such integrated circuits.

SUMMARY

A protective device in a semiconductor may comprise a substrate of a first conductivity type, an epitaxial layer formed on top of the substrate, a body area formed within the epitaxial layer of a second conductivity type extending from a top surface into the epitaxial layer, a first area of the first conductivity type extending from the top surface into the body area, an isolation area surrounding the first area, a ring area of the first conductivity type surrounding the isolation area, and a coupling structure for connecting the ring area with the substrate.

BRIEF DESCRIPTION OF THE DRAWINGS

The present invention is better understood by reading the following description of non-limiting embodiments with reference to the attached drawings which are briefly described as follows.

Figure 1:
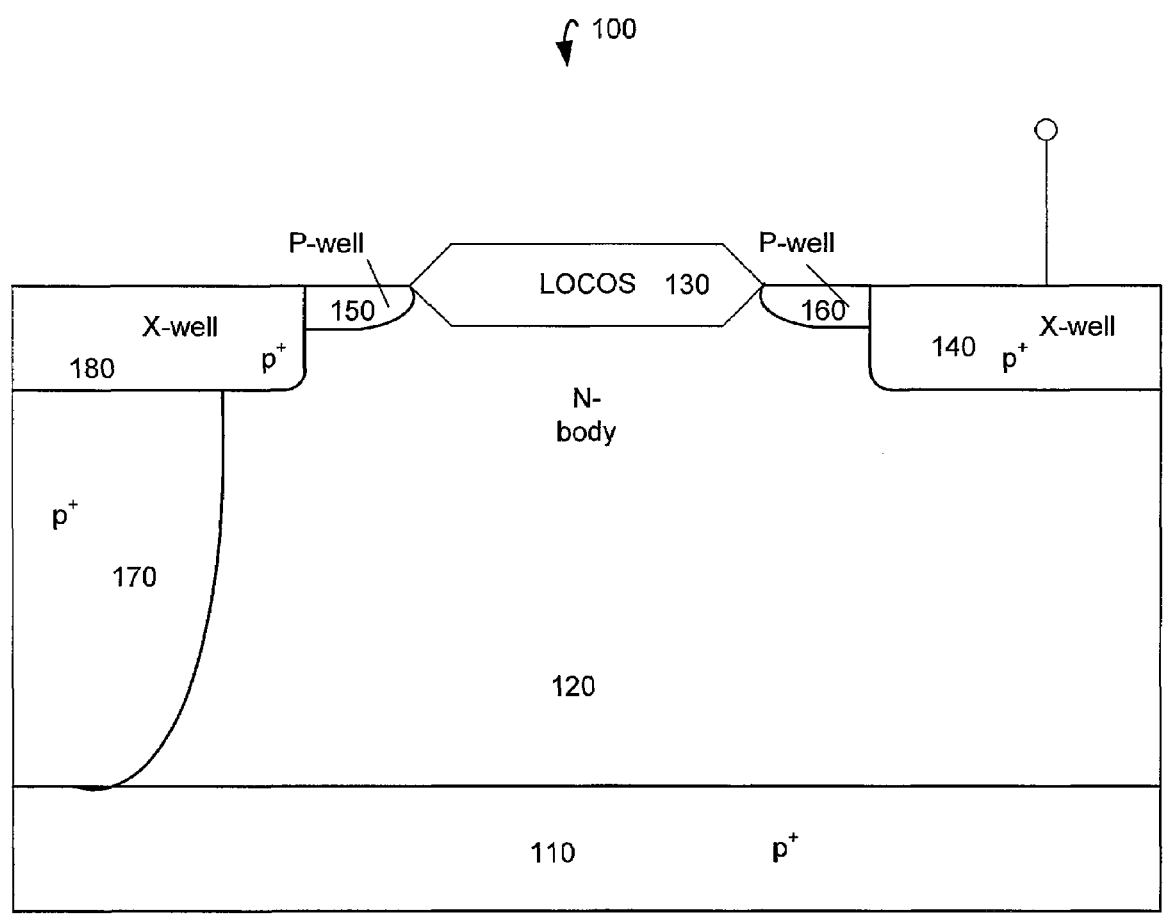
FIG. 1 shows sectional view of a first embodiment.

It is to be noted, however, that the appended drawings illustrate only a few aspects of certain embodiments of this invention and are therefore not limiting of its scope, as the invention encompasses equally effective additional or equivalent embodiments.

DETAILED DESCRIPTION

A protective device may further comprise a first intermediate ring area of the first conductivity type arranged between the first area and the isolation area, and a second intermediate ring area of the first conductivity type arranged between the isolation area and the ring area. The first and second intermediate areas may be less doped than the first area. The first area and the ring area may extend from the top surface deeper into the epitaxial layer than the first and second intermediate areas. The isolation area can be formed by local oxidation of silicon or other isolation methods. The body area may extend to a top surface of the substrate. The body area may be embedded into the epitaxial layer in such a way that the epitaxial layer surrounds the body area with a cup-shaped form. The first area may have a circular, square, octagonal, or polygonal shape. The isolation area and the ring area have a circular, square, octagonal, or polygonal shape. The coupling structure may be a sinker of the first conductivity type. The sinker can be adjacent to the ring area and may reach from the top surface to the substrate. The sinker can be arranged below the ring area and may reach from a bottom of the ring area to the substrate. The coupling structure can be a trench structure filled with a conductive material. A protective device may further comprise metal barrier layers between the trench structure and the ring area and the substrate, respectively. A protective device may further comprise an LDMOS transistor having a gate, wherein the gate is electrically connected with the first area. The LDMOS transistor may comprises a source zone being adjacent and may be connected to the coupling structure.

A protective device in a semiconductor may comprise a substrate of a first conductivity type, an epitaxial layer formed on top of the substrate, a body area formed within the epitaxial layer of a second conductivity type extending from a top surface into the epitaxial layer, a first area of the first conductivity type extending from the top surface into the body area, a first ring area of the first conductivity type surrounding the first area, an isolation area surrounding the first ring area, a second ring area of the first conductivity type surrounding the isolation area, a third ring area of the first conductivity type surrounding the second ring area, a coupling structure for connecting the second ring area with the substrate.

The first and second ring areas may be less doped than the first area. The first area and the third ring area may extend from the top surface deeper into the epitaxial layer than the first and second ring areas. The isolation area can be formed by local oxidation of silicon or other isolation methods. The body area may extend to a top surface of the substrate. The body area can be embedded into the epitaxial layer in such a way that the epitaxial layer surrounds the body area with a cup-shaped form. The first area may have a circular, square, octagonal, or polygonal shape. The isolation area and the first and second ring area may have a circular, square, octagonal, or polygonal shape. The coupling structure can be a sinker of the first conductivity type. The sinker can be adjacent to the third ring area and reaches from the top surface to the substrate. The sinker can be arranged below the third ring area and may reach from a bottom of the third ring area to the substrate. The coupling structure can be a trench structure filled with a conductive material. A protective device may further comprise metal barrier layers between the trench structure and the third ring area and the substrate, respectively. A protective device may further comprise an LDMOS transistor having a gate, wherein the gate is electrically connected with the first area. The LDMOS transistor may comprise a source zone being adjacent and connected to the coupling structure.

A power transistor with a protective device may comprise a substrate of a first conductivity type, an epitaxial layer formed on the substrate; wherein the power transistor comprises a source zone and a drain zone formed within the epitaxial layer; an insulated gate arranged on top of the epitaxial layer; wherein the protective device comprises a body area formed within the epitaxial layer of a second conductivity type extending from a top surface into the epitaxial layer, a first area of the first conductivity type extending from the top surface into the body area, an isolation area surrounding the first area, a ring area of the first conductivity type surrounding the isolation area, a coupling structure for connecting the ring area with the substrate, and wherein the gate is electrically connected with the first area.

A protective device may further comprise a first intermediate ring area of the first conductivity type arranged between the first area and the isolation area, and a second intermediate ring area of the first conductivity type arranged between the isolation area and the ring area. The first and second intermediate areas may be less doped than the first area.

FIG. 1 shows a partial sectional view of an embodiment of a protection device. The device showed in this embodiment can be symmetrical. Thus, in FIG. 1 only the left side of this embodiment is shown. As typical for any semiconductor device a substrate 110 which can be for example p$^+$-doped is provided. On top of this substrate a p-doped epitaxial layer may be grown using standard technology. In one embodiment, this epitaxial layer is overwritten by n-doping to form an n-doped area or body 120. In one embodiment, a local oxidation of silicon (LOCOS) process is used to produce an isolation area 130 arranged on top of this n-doped area or body 120. This LOCOS isolation area 130 may surround a first p-doped well 160 which surrounds a first p$^+$-doped X-well 140 which forms the center of the device. However, in other embodiments, other types of insulation processes can be used. The p$^+$-doped X-well 140 may extend from the top surface into the n-doped area or body 120. As shown on the left side of the LOCOS isolation area 130, in one embodiment, a second p-doped well 150 may surround the LOCOS isolation area 130. This p-doped well 150 may again be surrounded by a second p-doped X-well 180. The second p-doped X-well, again may reach deeper into the n-doped area or body 120 similar like the first X-well 140. Thus an outer ring can be formed by the second X-well 180 and an inner island can be formed by the first X-well 140. The p$^+$-doped X-wells 140 and 180 can be higher doped than the p-doped wells 150 and 160. Thus, in one embodiment, a stepped transition towards the LOCOS area is formed. Alternatively, in one embodiment, a single area 140 and a single ring structure 180 could substitute the stepped transition area.

The outer X-well ring 180 may be coupled with the p-doped substrate 110, for example, in one embodiment by means of a sinker structure 170. However other structures may be used to couple the outer X-well ring with the substrate 110. In one embodiment, the sinker structure may completely surround the n-doped area or body 120 in this embodiment to form the protective device. However, if, in one embodiment, the n-doped area or body 120 is only partially formed within the p-doped epitaxial layer, thus, being effectively embedded and surrounded by the p-doped epitaxial layer, the sinker may not necessarily surround this structure and could be placed on a suitable single location.

Figure 2:
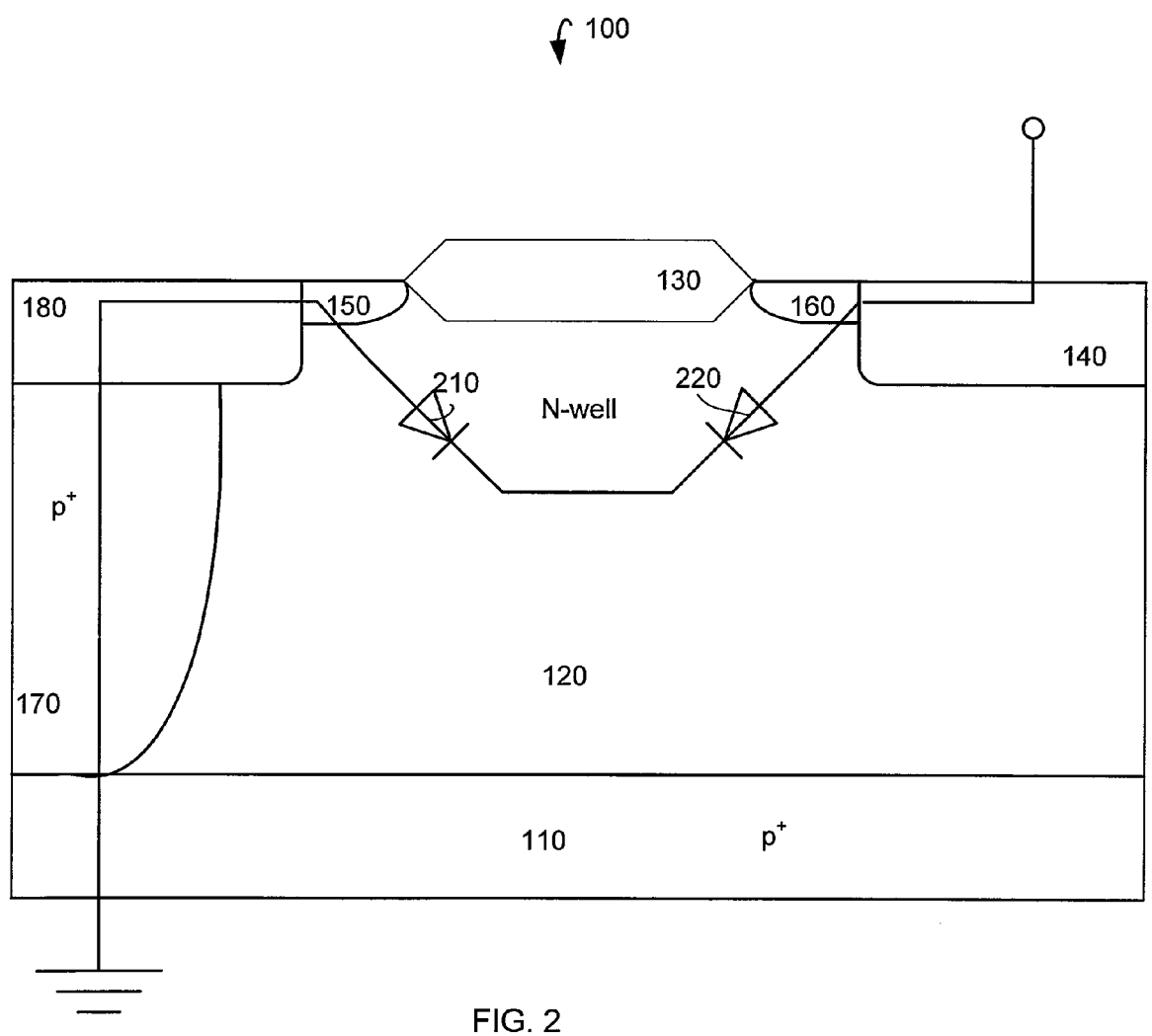
FIG. 2 shows an equivalent circuit overlay for the first embodiment.

FIG. 2 shows an exemplary overlay of the equivalent circuit formed by this protection structure. As can be seen, in this embodiment, the substrate 110 which is usually grounded is connected through the sinker 170 and the second X-well with the p-well 150. The p-n transition between the p-well 150 and the n-doped area or body 120 forms a first diode 210. On the right side of the LOCOS isolation area, the n-doped area or body 120 and the first p-well 160 form a second p-n transition which forms a second diode 220 coupled in reversed bias with the first diode 210. The inner ring 140 formed by the first X-well is coupled with the gate of an LDMOS transistor.

Figure 3:
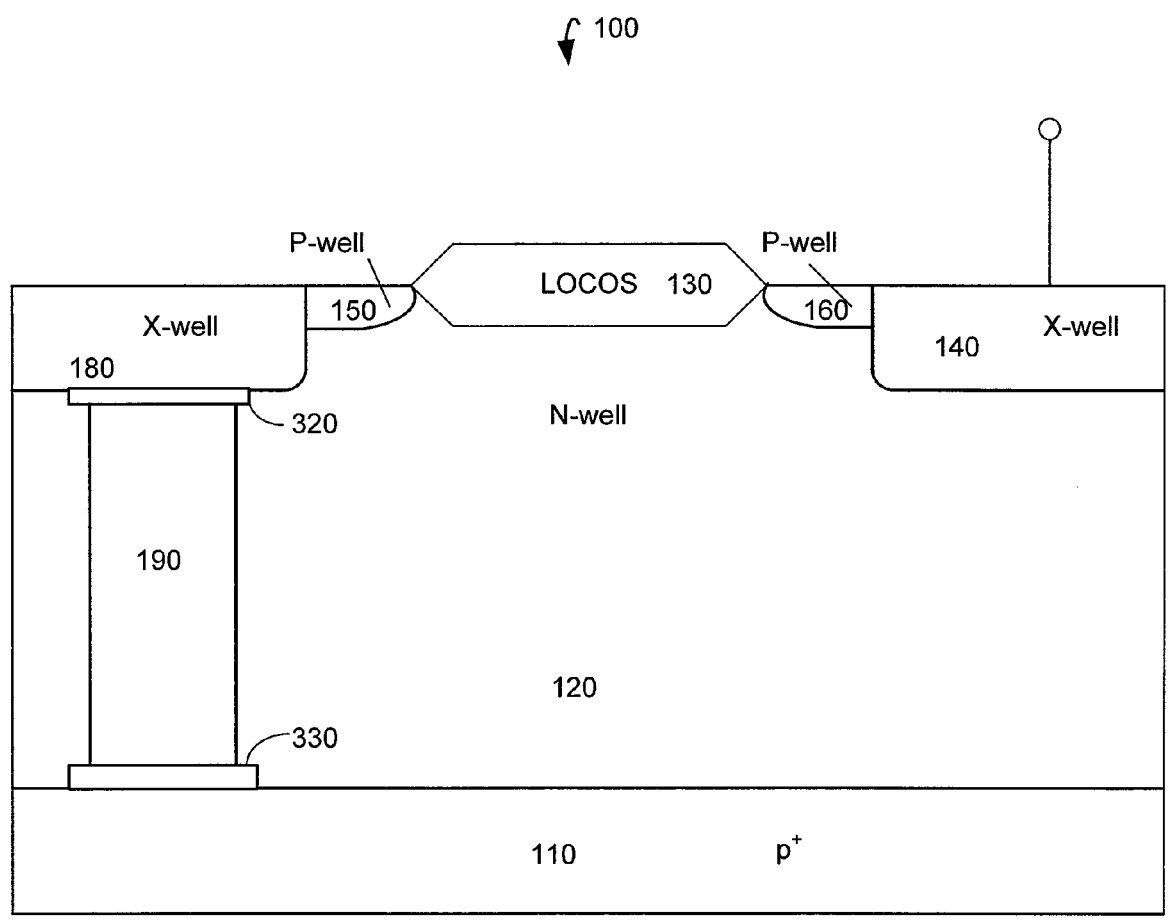
FIG. 3 shows a sectional view of a second embodiment.

FIG. 3 shows in another embodiment, how such a protection device can be realized. In this embodiment, the coupling between the outer X-well ring 180 and the substrate 110 is performed by a trench 190 which can be filled with any suitable metal or conductive material. The upper and lower contact areas 320 and 330 may be inserted if necessary depending on the choice of material used. For example, these areas 320, 330 can be metal barrier layers. Similarly, as explained with the embodiment shown in FIG. 1, if the n-doped area or body 120 in this embodiment is only partially formed within the p-doped epitaxial layer, thus, being effectively embedded and surrounded by the p-doped epitaxial layer, the trench may not necessarily have to completely surround this structure and could be placed on a suitable location.

Figure 4A:
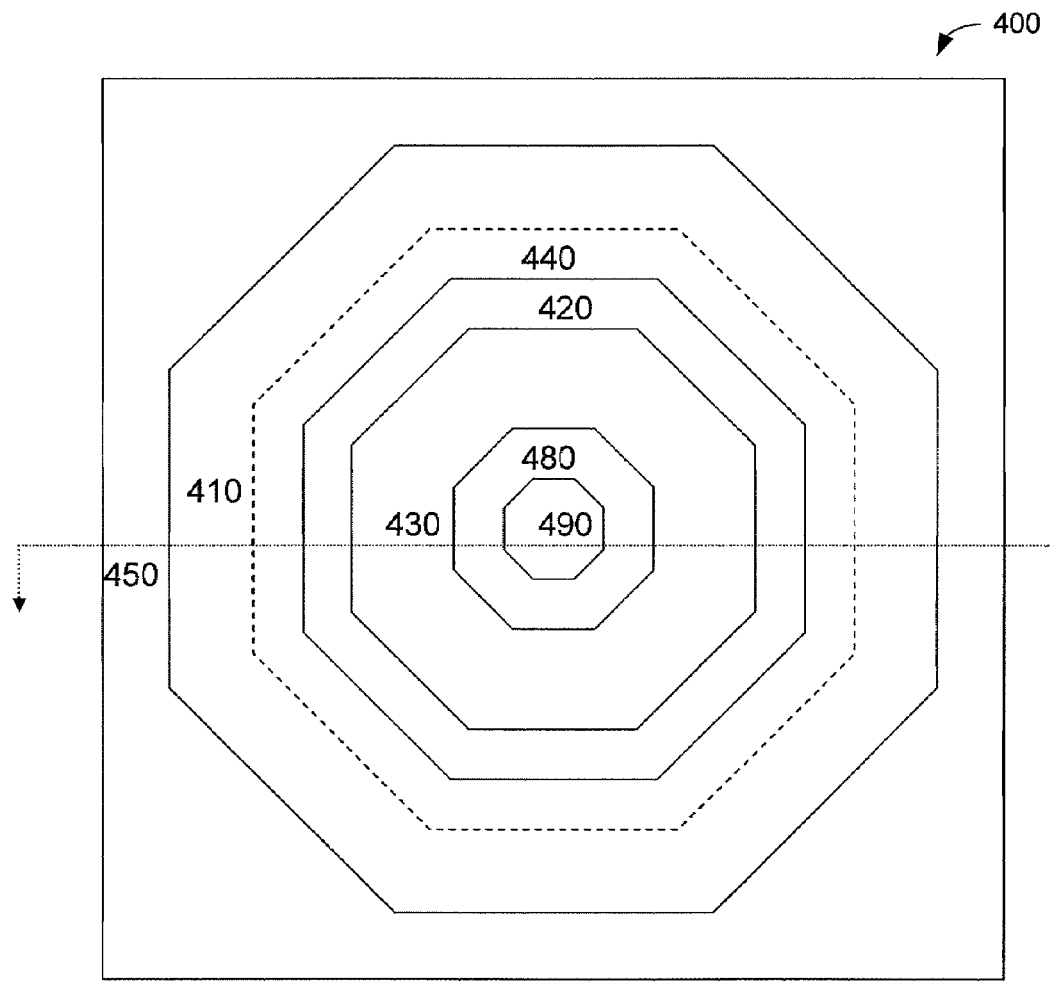
FIGS. 4A and 4B shows a top view and a sectional view of a third embodiment.
Figure 4B:
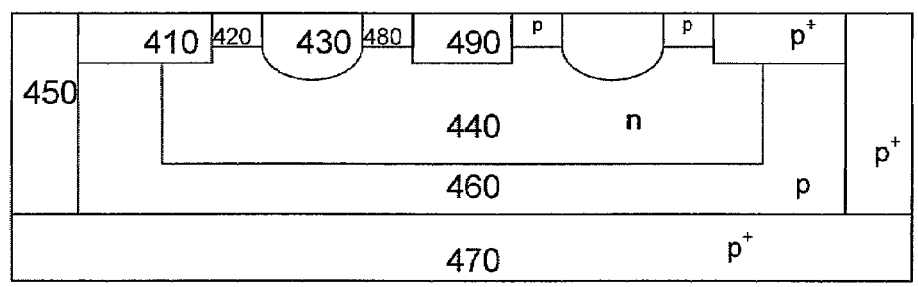

FIGS. 4A and 4B show another embodiment, for example on a P+ doped substrate. Again the protective device is formed on this semiconductor substrate 470. A p doped epitaxial layer 460 is formed on the top of the substrate. In this embodiment, this epitaxial layer is only partially overwritten by an n-doped area or body 440 which is formed within this epitaxial layer 460. As explained above, in the embodiments shown in FIGS. 1-3, the epitaxial layer is completely overwritten through n-type doping. However, n-type area or body might also be created in a different way.

In this embodiment, the remaining p-type epitaxial layer 460 takes the shape of a saucer or cup which effectively surrounds the n-doped area or body 440. The epitaxial layer 460 is surrounded by a p+ doped outer ring 450 which reaches from the substrate to the top of the device. The top edges of the epitaxial layer 460 in this embodiment do not reach to the top of the device. Rather, a p+ doped ring reaches from the top surface into the epitaxial layer. This ring 410 can be wider than the side walls of the remaining epitaxial layer 460 as shown in FIG. 4B. In one embodiment, adjacent to ring 410 is a first p doped inner ring 420 followed by a second p doped inner ring 480 which is separated from the first ring 420 by a ring shaped LOCOS area 430. In one embodiment, in the center of the device may be another p+ doped area 490 which is surrounded by the second ring 480. As shown in FIG. 4, in one embodiment, the ring 410 could reach into the n-doped area or body 440 either deeper than the ring 420, thereby overlapping ring 420 or shallower than ring 420 thereby being embedded in ring 420. In one embodiment, the same may apply to the ring 480 and area 490. In other embodiments, the rings 420 and 480 also may or may not reach deeper into the n-doped area or body 440 than the LOCOS area 430. As can be seen in FIG. 4A, in one embodiment, the rings formed by the different areas have the shape of an octagon. However, in other embodiments, they could also be polygonal, circular, symmetrical polygons without sharp corners, asymmetrical, etc. To serve as a protective device, the inner region 490 can in one embodiment, for example, be connected to the gate of a LDMOS/MOS transistor.

Figure 5A:
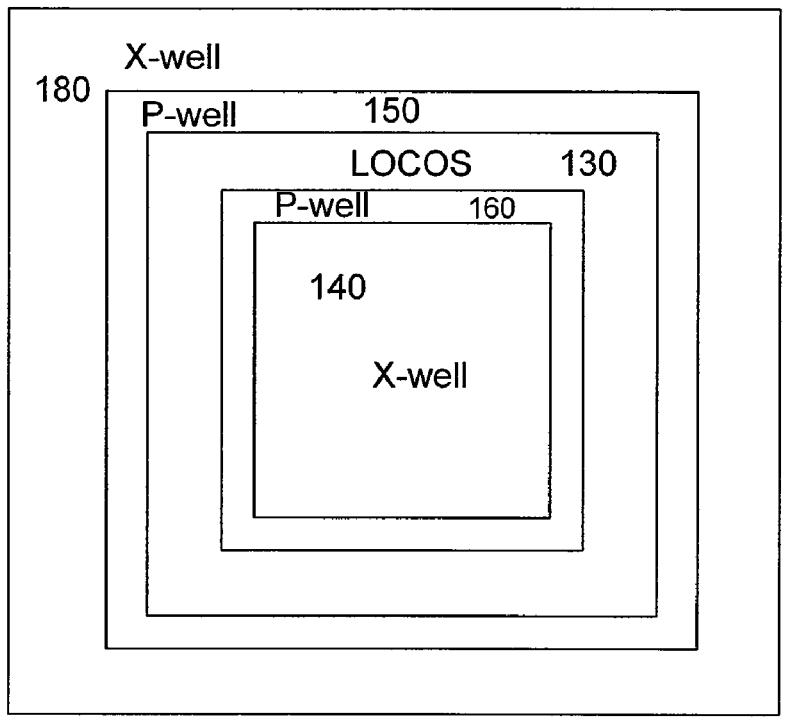
FIGS. 5A and 5B show top views of alternative embodiments.
Figure 5B:
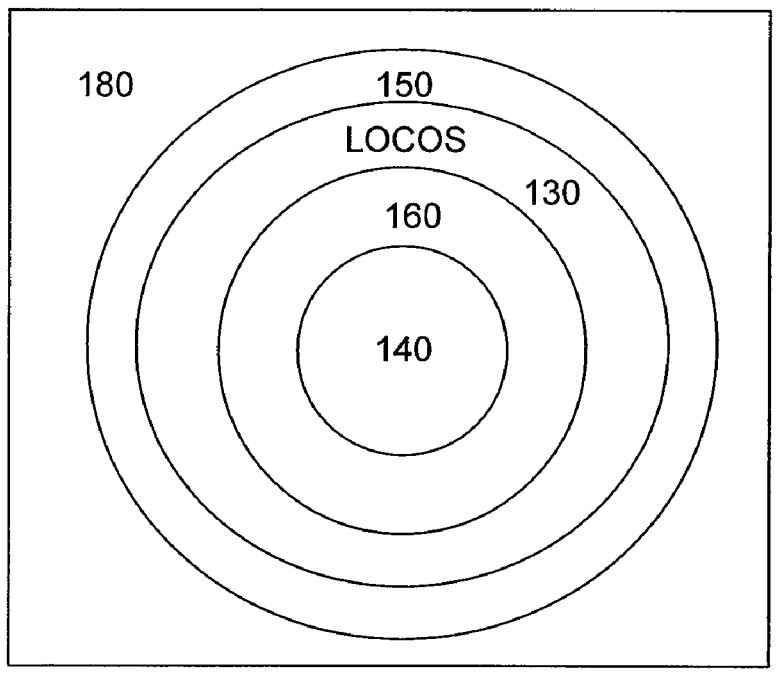

FIGS. 5A and 5B show other embodiments of the structure as shown in FIG. 1 or FIG. 3. As can be seen, in embodiments, the center well 140 has a square shape in FIG. 5A and a circular shape in FIG. 5B. In one embodiment, the rings can be formed around the center area and, thus, have a square shape in FIG. 5A and a circular shape in FIG. 5B. However, in other embodiments, any other ring shape is possible. Also, combinations of different shapes are possible. The n-doped area or body 120 is not shown in FIG. 5A and 5B.

Figure 6:
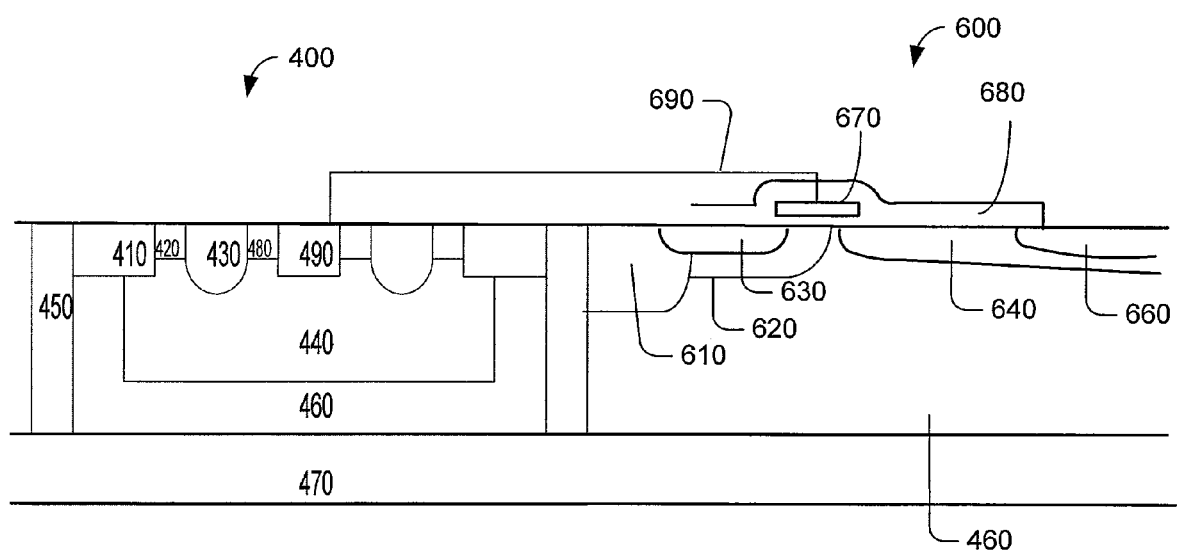
FIG. 6 shows another embodiment including a protective device and a transistor structure.

FIG. 6 shows another embodiment in which a protective device as for example shown in FIG. 4A and 4B is combined with an LDMOS transistor. In one embodiment, the transistor 600 is formed on the right side of the protection device and uses for example, the outer ring structure 450 as a sinker structure. In one embodiment, a gate 670 is formed within an isolation layer 680 above a channel defined by a source area 630 and a drain area 640. In one embodiment, a first p+ doped area 610 extends from the surface of the epitaxial layer and from the outer ring 450 into the epitaxial layer 460 and may partially cover the source area 630 which extends from the surface into the epitaxial layer 460. The remaining part of the source area 630 not covered by the area 610 can be covered by another p doped area 620. The drain in one embodiment is formed by a first n+doped drain area 660 extending from the surface into the epitaxial layer 460 and which is surrounded by a second n doped area 640 which reaches to the left up to the channel of the transistor 600. As shown in FIG. 6, in one embodiment, the region 610 could be either deeper than the region 620, thereby overlapping area 620 or shallower than region 620 thereby being embedded in area 620. The same applies to the regions 660 and 640. In one embodiment, the transistor or structure to be protected can be arranged close to the protective device as shown in FIG. 6. In other embodiments, such a close placement is not necessary, the protective device can also be arranged at a more remote location.

In one embodiment, the protective device is coupled with the transistor by coupling the gate 670 with the center area 490. In one embodiment, this can be performed by a standard metal layer indicated by numeral 690 or any other appropriate connection means. By comparing the protective device 400 and the transistor structure 600, one can clearly see that it requires just one additional doping region depending on the structure of the device, namely the n-doped region 440 in the embodiment of FIG. 6 or region 120 in the embodiments of FIG. 1-3, to form the ESD protection device. All other doping regions are already existing in a typical LDMOS transistors. It requires no extra mask to form the region 440.

The above described embodiments show a p-doped substrate and n-doped center area or body. However, the protective device can also be formed by using a n-doped substrate and a p-doped center area or body.

Although particular embodiments of the invention have been shown and described, the invention is not limited to the preferred embodiments and it will be apparent to those killed in the art that various changes and modifications may be made without departing from the scope of the invention, which is defined only by the appended claims and their equivalents.

What is claimed is:

1. A protective device in a semiconductor comprising:
a substrate of a first conductivity type,
an epitaxial layer formed on top of said substrate,
a body area of a second conductivity type formed within said epitaxial layer and extending from a top surface into said epitaxial layer,
a first area of the first conductivity type extending from said top surface into said body area,
an isolation area surrounding said first area,
a ring area of the first conductivity type surrounding said isolation area,
a coupling structure for electrically connecting said ring area with said substrate.

2. A protective device according to claim 1, further comprising
a first intermediate ring area of said first conductivity type arranged between said first area and said isolation area, and
a second intermediate ring area of said first conductivity type arranged between said isolation area and said ring area.

3. A protective device according to claim 2, wherein the first and second intermediate areas are less doped than the first area.

4. A protective device according to claim 2, wherein said first area and said ring area extend from said top surface deeper into said epitaxial layer than said first and second intermediate areas.

5. A protective device according to claim 1, wherein said isolation area is formed by local oxidation of silicon or other isolation methods.

6. A protective device according to claim 1, wherein said body area extends to a top surface of said substrate.

7. A protective device according to claim 1, wherein said body area is embedded into said epitaxial layer in such a way that the epitaxial layer surrounds said body area with a cup-shaped form.

8. A protective device according to claim 1, wherein said first area has a circular, square, octagonal, or polygonal shape.

9. A protective device according to claim 1, wherein said isolation area and said ring area have a circular, square, octagonal, or polygonal shape.

10. A protective device according to claim 1, wherein said coupling structure is a sinker of said first conductivity type.

11. A protective device according to claim 10, wherein said sinker is adjacent to said ring area and reaches from said top surface to the substrate.

12. A protective device according to claim 10, wherein said sinker is arranged below said ring area and reaches from a bottom of said ring area to the substrate.

13. A protective device according to claim 1, wherein said coupling structure is a trench structure filled with a conductive material.

14. A protective device according to claim 13, further comprising metal barrier layers between said trench structure and said ring area and said substrate, respectively.

15. A protective device according to claim 1, further comprising an LDMOS transistor having a gate, wherein said gate is electrically connected with said first area.

16. A protective device according to claim 15, wherein said LDMOS transistor comprises a source zone being adjacent and connected to said coupling structure.

17. A protective device in a semiconductor comprising:
a substrate of a first conductivity type,
an epitaxial layer formed on top of said substrate,
a body area of a second conductivity type formed within said epitaxial layer and extending from a top surface into said epitaxial layer,
a first area of the first conductivity type extending from said top surface into said body area,
a first ring area of the first conductivity type surrounding said first area,
an isolation area surrounding said first ring area,
a second ring area of the first conductivity type surrounding said isolation area,
a third ring area of the first conductivity type surrounding said second ring area,
a coupling structure for connecting said third ring area with said substrate.

18. A protective device according to claim 17, wherein the first and second ring areas are less doped than the first area.

19. A protective device according to claim 17, wherein said first area and said third ring area extend from said top surface deeper into said epitaxial layer than said first and second ring areas.

20. A protective device according to claim 17, wherein said isolation area is formed by local oxidation of silicon or other isolation methods.

21. A protective device according to claim 17, wherein said body area extends to a top surface of said substrate.

22. A protective device according to claim 17, wherein said first area has a circular, square, octagonal, or polygonal shape.

23. A protective device according to claim 17, wherein said isolation area and said first and second ring area have a circular, square, octagonal, or polygonal shape.

24. A protective device according to claim 17, wherein said coupling structure is a sinker of said first conductivity type.

25. A protective device according to claim 24, wherein said sinker is adjacent to said third ring area and reaches from said top surface to the substrate.

26. A protective device according to claim 24, wherein said sinker is arranged below said third ring area and reaches from a bottom of said third ring area to the substrate.

* * * * *